United States Patent [19]
Huber

[11] Patent Number: 5,877,614
[45] Date of Patent: Mar. 2, 1999

[54] ELECTRONIC SWITCH-MODE POWER SUPPLY

[75] Inventor: Andreas Huber, Traunreut, Germany

[73] Assignee: Siemens Aktiengesellschaft, Munich, Germany

[21] Appl. No.: 991,934

[22] Filed: Dec. 16, 1997

[30] Foreign Application Priority Data

Dec. 18, 1996 [DE] Germany ................... 196 52 808.9

[51] Int. Cl.$^6$ .............................. G05F 1/56; H02M 7/04
[52] U.S. Cl. ............................................ 323/282; 363/89
[58] Field of Search .................................. 323/282, 284, 323/349, 351, 902; 363/125, 126, 89, 84

[56] References Cited

U.S. PATENT DOCUMENTS

| 4,821,166 | 4/1989 | Albach ................................. 363/89 |
| 5,068,572 | 11/1991 | Blankers ............................ 315/209 R |
| 5,087,871 | 2/1992 | Losel .................................... 323/299 |
| 5,095,261 | 3/1992 | Schoofs ................................ 323/222 |
| 5,128,854 | 7/1992 | Raets .................................... 363/89 |
| 5,237,261 | 8/1993 | Haapakoski .......................... 323/282 |
| 5,283,707 | 2/1994 | Conners et al. ........................ 361/58 |
| 5,386,187 | 1/1995 | Bichler et al. ........................ 323/222 |
| 5,652,702 | 7/1997 | Clawin et al. .......................... 363/89 |

FOREIGN PATENT DOCUMENTS

| 0 423 885 | 10/1990 | European Pat. Off. . |
| 34 02 222 | 7/1985 | Germany . |

OTHER PUBLICATIONS

Patent Abstracts of Japan—E-756 May 11, 1989 vol. 13/No. 198-1-19970.
Patent Abstracts of Japan—E-687 Nov. 28, 1988 vol. 12/No. 452-63-178763.
U. Tietze Ch. Schenk—Halbleiter–Schaltungstechnik—pp. 561–582—1989.

*Primary Examiner*—Adolf Deneke Berhane
*Attorney, Agent, or Firm*—Hill & Simpson

[57] ABSTRACT

An electronic switch-mode power supply has a rectifier circuit at a line ac voltage and which comprises a pair of outputs at high level or at ground reference potential, and having an output stage that supplies a smoothed dc voltage. The rectifier circuit is connected to the output stage via an electronic switch and, triggered by a switch control signal supplied to the electronic switch can thus be optionally coupled to the outputs of the rectifier circuit. The electronic switch comprises a transistor switch element and a control transistor, the transistor switch element comprising a switching path arranged between the output of the rectifier circuit lying at high level and the corresponding terminal of the output stage, and which comprises a control input that is held to blocking potential via the conductively maintained switching path of the control transistor driven by the switch control signal, or is held to make potential given an inhibited control transistor. The switch-mode power supply is employable in dc voltage-converted power supplies, particularly given relatively high supply voltages.

10 Claims, 2 Drawing Sheets

RECTIFIER CIRCUIT — ELECTRONIC SWITCH — OUTPUT STAGE

ELECTRONIC SWITCH-MODE POWER SUPPLY

BACKGROUND OF THE INVENTION

The invention is directed to an electronic switch-mode power supply wherein a rectifier circuit connected to a line ac voltage is connected to an output stage for supplying a smooth dc voltage via an electronic switch.

Power packs fed from a line ac voltage for the dc supply of a load are known in numerous embodiments. An overview of circuit principles standard therefor is provided, for example, by Tietze-Schenk, "Halbleiter-Schaltungstechnik", Springer Verlag Berlin, $9^{th}$ Edition 1989, Section 18.5 "Schaltnetzgerate", pp. 561 ff. Expressed in simplified fashion, such switched-mode power supplies comprise a rectifier circuit (frequently implemented as a rectifier bridge) connected to the feeding line ac voltage. The rectifier circuit supplies a pulsating dc voltage that is converted into a smoothed dc voltage in an output stage of the switched-mode power supply connected to it. As presented in greater detail in the above reference, these output stages can be rather differently designed dependent on the application, for example as a flow converter or a blocking oscillator.

The implementation of the output stage in and of itself is of only secondary significance for the initially cited electronic switched-mode power supply since it can be utilized in conjunction with a plurality of known output stages. What is thereby more critical, however, is that the smoothed output dc voltage is usually taken in the output stages at a storage capacitor having a relatively high capacitance. The necessary charging of this storage capacitor upon initialization of the switched-mode power supply causes a correspondingly high current at make. Not only the switched-mode power supply itself but also the entire supply chain at the preceding input side must be designed for this.

In this context, DE-A-34 02 222 discloses a circuit arrangement for limiting excess voltages in dc on-board networks. A controllable switch thereby has its switching path inserted into the mains line lying at low potential. A comparator with two inputs is also provided. One of these inputs is connected via a constant voltage source to the output side of this switching path, and the second of these inputs is connected to the other mains line. The comparator compares the signals supplied to it via its two inputs and controls the switch such that a device connected to this circuit arrangement is disconnected from the mains, given excess voltages. The controllable switch can also be designed as a semiconductor switch. On the basis of a capacitor lying in its drive circuit, this enables the high current surge at make to be reduced given a high capacitive load through the connected device.

Further, EP-A-0 423 885 discloses a power supply unit with a circuit for limiting the current at make. This circuit comprises a first semiconductor switch whose switching path, together with a resistor lying parallel to it, is connected into the supply line lying at low potential. An RC element as well as (in parallel thereto) the switching path of a second semiconductor switch are provided in the drive network of this first semiconductor switch. The control electrode of the second semiconductor switch is connected to the tap of a voltage divider to which a second capacitor in turn lies parallel. The switching path of a third semiconductor switch is also connected between the tap of the voltage divider and the supply line lying at low potential. This third semiconductor switch is controlled dependent on a control current supplied by a threshold circuit such that it blocks the supply voltage when a predetermined threshold is downwardly exceeded.

Specifically this last-cited, known circuit arrangement is very complicated in circuit-oriented terms—given all its functional advantages. What both known circuit arrangements also have in common is that they disconnect a connected output stage or a device supplied with the supply voltage from the dc supply with a switch coupled into the supply or mains line lying at low potential. They are switched-mode power supplies with what are referred to as "low side" switches. This supply line usually lies at ground reference potential. A different ground reference potential can thus derive given the different operating conditions at different assemblies, this having to be taken into consideration in the circuit design and definitely potentially making the implementation of the circuit more difficult.

This expense can be avoided given what are referred to as switch-mode power supplies with "high side" switches having controlled switches whose switching path is coupled into the supply line lying at high dc voltage potential.

However, P-channel types, with their known disadvantages, are usually utilized therein for the controlled switches when, of course, they are designed as semiconductor switches.

SUMMARY OF THE INVENTION

The present invention is therefore based on the object of improving a switch-mode power supply of the type initially cited such that—given low expense for components—a controlled switching of the rectified line ac voltage is implemented with a cost-beneficial power semiconductor switch in the branch of its supply lying at high potential, so that an interruption of the supply line lying at low potential is avoided and a controlled current limiting is enabled at the same time.

According to the present invention, an electronic switch mode power supply is provided having a rectifier circuit connected to a line ac voltage, and which has a pair of outputs respectively at a high level and at ground reference potential. An output stage is provided for supplying a smooth dc voltage, and is connected to the rectifier circuit via an electronic switch. The electronic switch is triggered by a switch control signal, and optionally couples the rectifier circuit output at a high level to the output stage. The electronic switch has a transistor switch element and a control transistor. The transistor switch element has a switching path arranged between the high level output of the rectifier circuit and a corresponding terminal of the output stage. A control input of a transistor switch element is connected to be held to blocking potential via a conductively maintained switching path of the control transistor which is driven by a switch control signal and is always held to make potential given an inhibited control transistor.

A critical advantage of the solution of the invention is comprised in that a faultless deactivation is thus established with little expense for components upon employment of cost-beneficial components, that a limiting of the current at make that is controlled in stable fashion can be enabled at the same time, this in turn allowing the use of cost-beneficial components (because they can be dimensioned smaller) not only in the output stage. This also means that the circuit expense at the supply side is reduced. Given larger systems, for example, the plurality of automatic protection units can be reduced because lower excess current loads occur in the network. This is of particular significance when the device to be supplied requires a supply voltage lying at relatively high potential for standard dc voltage supplies. A high operating dependability is then nonetheless achieved.

Finally, the components lying in the current path are operated more gently, even in the switching events, since surge loads are avoided. What this means in view of the storage capacitor in the power unit, for example, is that it is more resistant to aging.

Exemplary embodiments of the invention are explained in greater below with reference to the drawings.

DESCRIPTION OF THE PREFERRED EMBODIMENTS

Figure 1:
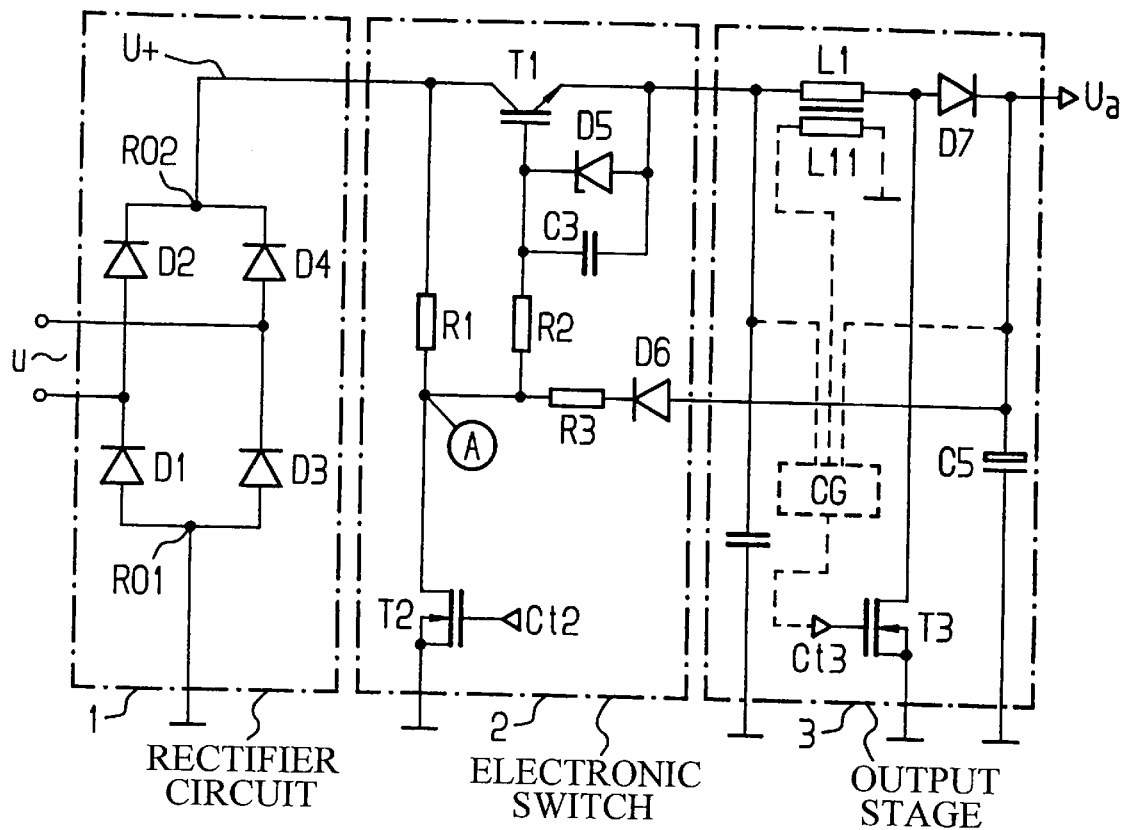
FIG. 1 is a schematic diagram of a switch-mode power supply according to the invention with a rectifier bridge and an output stage that is designed as a step-up regulator of an electronic ballast for the operation of fluorescent lamps, as well as with an electronic switch that is arranged between these and has a control transistor allocated thereto.

As an example, a switch-mode power supply with an output stage is selected in FIG. 1, this being designed as a step-up regulator of an electronic ballast for fluorescent lamps. In this example, a line ac voltage u~ is supplied—potentially via a harmonic filter (not shown)—to a rectifier bridge 1 that is constructed of four diodes D1 through D4 and comprises two outputs RO1 or RO2. The output RO1 of the rectifier bridge 1 is thereby applied to ground reference potential. At the second output RO2, which lies at high potential, the rectifier bridge 1 outputs a rectified voltage U+ derived from the line ac voltage u~. This second output RO2 of the rectifier bridge 1 is connected to the input of a step-up regulator 3 via an electronic switch 2 that shall be explained in greater detail later. An inductor L1 is connected to this input of the step-up regulator 3 lying at high potential, said inductor L1, on the other hand, being connected via a charging diode D7 polarized in a conducting direction to the plus pole of a storage capacitor C5 designed as an electrolyte capacitor whose second pole is applied to ground reference potential. The junction between inductor L1 and charging diode D7 is likewise applied to ground reference potential via the switching path of a switching transistor T3. The plus pole of the storage capacitor C5 forms the output of the step-up regulator 3 at which a stepped-up, smoothed dc voltage Ua is output to a lamp circuit (no longer shown in FIG. 1).

The above-described circuit arrangement is to be viewed as known in electronic ballasts for fluorescent lamps. With the assistance of the rectifier bridge 1, the rectified, pulsating dc voltage U+ is generated from the line ac voltage u~ and is supplied to the step-up regulator 3 via the electronic switch 2. When the switching transistor T3 is conductive, the current in the inductor L1 rises essentially linearly. The switching transistor T3 is inhibited when a predetermined limit value is reached, so that the energy stored in the inductor L1 discharges into the storage capacitor C5 via the charging diode D7. At the time this charging operation ends, the switching transistor T3 is closed again and the described function is repeated. The momentary value of the rectified, pulsating voltage U+ thereby serves as a rated value for the deactivation times of the switching transistor T3. Sequential to these events with a sequence which has a repetition rate that is higher compared to the line frequency, the storage capacitor C5 charges to the smoothed output voltage Ua of the switched-mode power supply, whose level lies above the peak value of the rectified voltage U+.

In order to realize the described function of the switching transistor T3, an appropriate control signal Ct3 must be supplied to it. How these control signals Ct3 are generated is definitely at the command of a person skilled in the art and is of secondary significance here. One such possibility is therefore merely schematically indicated in FIG. 1 by way of example with broken lines and in a block circuit diagram. A signal generator CG detects the momentary value of the rectified voltage U+, the discharge events thereof via an auxiliary winding L 11 of the inductor L1, and the momentary charge condition of the storage capacitor C5, and generates the control signals for the switching transistor T3 from these detection signals.

A relatively high current at make when the storage capacitor C5 first discharged upon initialization is charged derives from the above explanation of the step-up regulator 3 and which, in combination with the rectifier bridge 1, conventionally forms the power pack of an electronic ballast for fluorescent lamps. In order to monitor this current load, the electronic switch 2 is then arranged between the rectifier bridge 1 and the step-up regulator 3. This electronic switch 2 comprises a transistor switch element T1 that, in particular, is designed as an N-channel semiconductor switch element and has its switching path arranged between the output RO2 of the rectifier bridge 1 lying at high potential and the corresponding input of the step-up regulator 3. Dependent on the application, this transistor switch element can be designed as a MOSFET, as an IGBT (Insulated Gate Bipolar Transistor), or as some other bipolar power transistor. Via a drop resistor R1 lying in front of the transistor switch element T1, a further switching transistor T2 has its switching path arranged between the input of the electronic switch 2 lying at high potential and ground reference potential. The junction A of the drop resistor R1 with the second switching transistor T2 is connected to the control input of the transistor switch element T1 via an input resistor R2. Via the series circuit of a further resistor R3 and a coupling diode D6, this junction A is also connected to the pole of the storage capacitor C5 lying at high potential. Further, the parallel circuit of a Z-diode D5 as well as a further capacitor C3 is provided between the emitter output of the transistor switch element T1 and its control input.

The electronic switch 2 remains deactivated and thereby disconnects the output of the rectifier bridge 1 from the input of the step-up regulator 3 lying at high potential insofar as the second switching transistor T2 is activated via a corresponding control signal Ct2 supplied to it. Then the junction A between this second switching transistor and the drop resistor R1 lies at ground reference potential and inhibits the transistor switch element T1.

The second switching transistor T2 is inhibited in order to then switch the electronic switch 2 transmissive. In this condition of the second switching transistor T2, current flows across the drop resistor R1 and the input resistor R2, with which the capacitor C3 connected to the control input of the transistor switch element T1 is charged. Caused by the time constant of the RC element with the resistors R1, R2 and the capacitor C3, the voltage at the control input of the transistor switch element T1 slowly rises. As a result thereof, the transistor switch element T1 is also not immediately driven, but is switched transmissive in a continuous transition. I.e., the active region of the transistor switch element T1 is slowly traversed and the current at make of the connected step-up regulator 3 is thereby limited to a predetermined peak value.

In this turn-on phase, the storage capacitor C5 of the step-up regulator 3 is correspondingly slowly charged to the peak value of the line ac voltage u~. The switching transistor T3 is then driven. In the stationary condition of the step-up regulator 3, finally, the stepped-up output voltage Ua is available. Only then is an auxiliary voltage that is greater than the momentary value of the rectified voltage U+ supplied to the electronic switch 2 delivered to the control input of the transistor switch element T1. This auxiliary voltage is taken from the output side of the switch-mode power supply itself and is supplied to the control input of the transistor switch element T1 via the coupling diode D6 and the resistors R3, R2 in the example of the circuit arrangement according to FIG. 1. Only on the basis of this auxiliary voltage is the transistor switch element T1 ultimately driven into saturation, so that its current-limiting effect is then eliminated.

The explained limiting of the current at make of the step-up regulator 3 or more generally, of the output stage of the power pack connected to the electronic switch not only means that the components thereof lying in the corresponding current path are stressed less during turn-on events, which contributes to a lengthening of the service life and also potentially enables a more favorable dimensioning. Since the transistor switch element T1 is arranged in the current path lying at high potential and only acts on this, any and all influence on the ground reference potential of the switched-mode power supply is avoided over and above this and, thus, the initially cited disadvantages connected therewith are precluded. Finally, a switch is realized in the current path lying at high potential in a simple way in circuit-oriented terms, this being capable of being implemented with commercially obtainable N-channel semiconductor switch elements. This is more advantageous than having to utilize P-channel types with their known disadvantages therefor.

Figure 2:
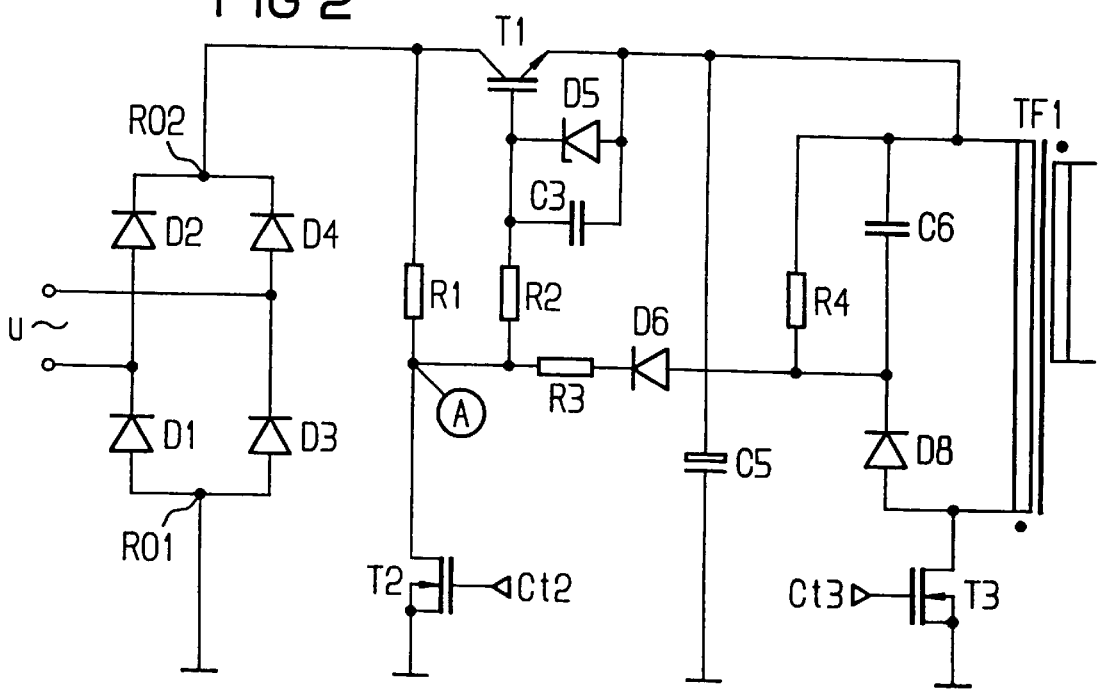
FIGS. 2 and 3 are respective circuit modifications in conjunction with an output stage designed as a blocking oscillator.

FIG. 2 shows a further exemplary embodiment for a switch-mode power supply working according to the above-explained function principle whose output stage is designed as blocking oscillator 31 in this case. Blocking oscillators are adequately known per se, so that it is indeed adequate here to point out that the inductor L1 of the exemplary embodiment of FIG. 1 is expanded in this case to form a transformer TF1 whose primary winding—analogous to the exemplary embodiment of FIG. 1—is applied to ground reference potential via the switching transistor T3. All other components of the circuit arrangement that coincide at least functionally with the exemplary embodiment shown in FIG. 1 are also provided with coinciding reference characters. In particular, this is also truce of the storage capacitor CS that is arranged lying parallel to the primary winding of the transformer TF1 in this case.

Additionally, a further diode D8 in series with the parallel circuit of a further capacitor C6 and of a further resistor R4 is connected parallel to this primary winding of the transformer TF1 in this exemplary embodiment. This branch parallel to the primary winding of the transformer TF1 forms a voltagelimiting network from which the auxiliary voltage is taken in this exemplary embodiment in order to drive the transistor switch element T1 into saturation. As in the exemplary embodiment of FIG. 1, it is also valid here that the storage capacitor C5 is first charged to the peak value of the line ac voltage Ua given a turn-on event. As soon as the switching transistor T3 is then driven, the stationary condition of the switched power unit occurs, this comprising the capacitor 5 and the transformer TF1 here. A defined voltage that forms the auxiliary voltage for the drive of the transistor switch element T1 then is present at the cathode of the diode D8 in the network lying parallel to the primary winding thereof. Moreover, the circuit parts comprising the rectifier bridge 1 and the electronic switch 2 are constructed completely identical to the first exemplary embodiment described on the basis of FIG. 1 and also effect the same circuit functions. Repeating details about the circuit structure and the function here is therefore superfluous.

Figure 3:
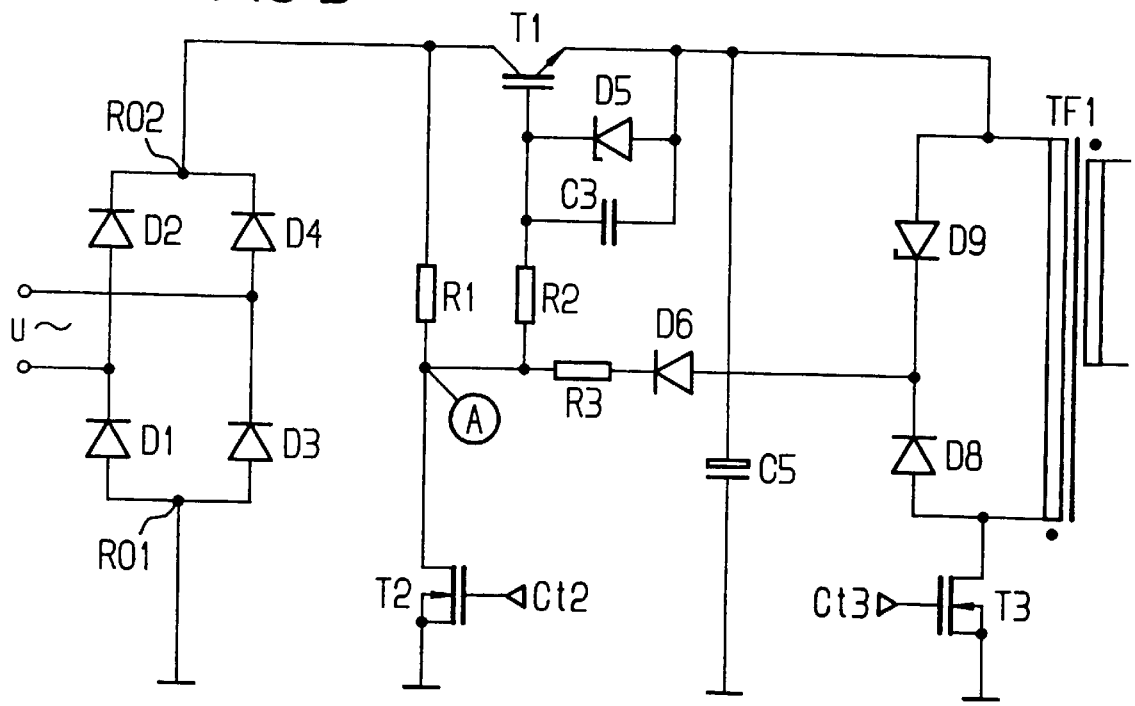

The exemplary embodiment shown in FIG. 3 differs from the exemplary embodiment of FIG. 2 only with respect to the voltage-limiting network connected parallel to the primary winding of the transformer TF1. In this case, the RC element formed of the resistor R4 and the capacitor C6 according to FIG. 2 is replaced by a further Z-diode D9.

Figure 4:
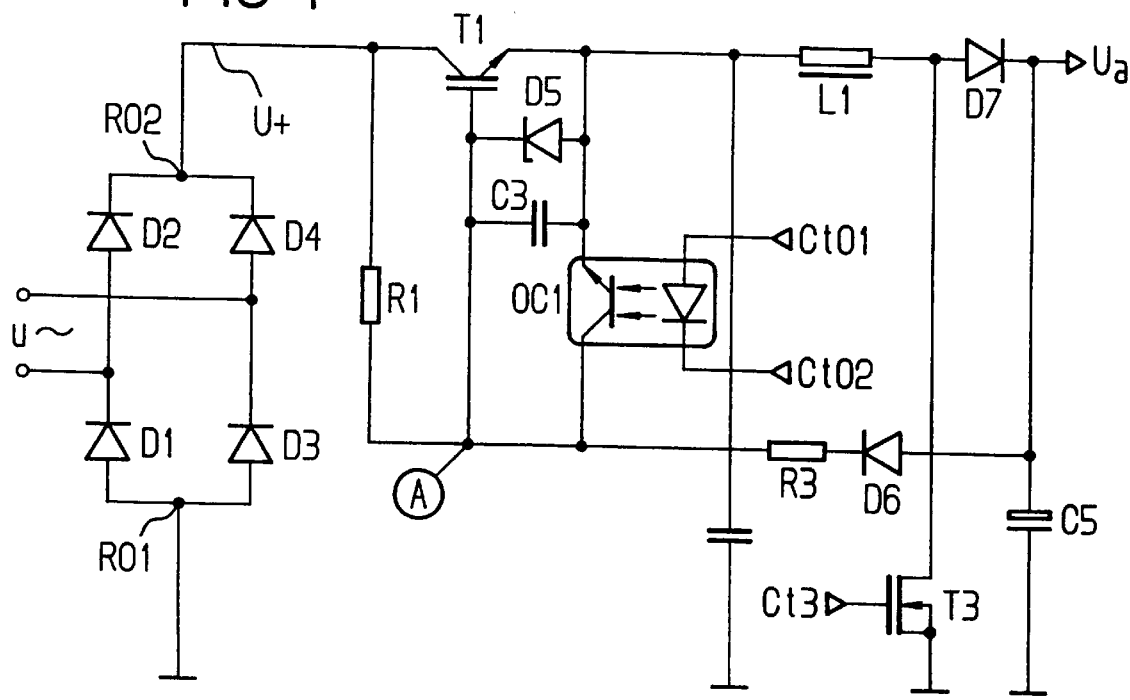
FIG. 4 is a further embodiment wherein an optocoupler is allocated to the electronic switch.

In a further exemplary embodiment, FIG. 4 shows an alternative for the drive of the transistor switch element T1. Although this alternative can be generally employed, it is shown here—for the sake of simplicity—in conjunction with the step-up regulator 3 selected for the first exemplary embodiment, so that only the circuit differences compared to FIG. 1 are to be pointed out here.

In the exemplary embodiment of FIG. 4, the drive of the transistor switch element T1 is electrically decoupled since an optocoupler OC1 that is allocated to the control input of the transistor switch element T1 is arranged in the network instead of the second switching transistor T2. It is schematically indicated that this optocoupler OC1 has its control inputs supplied with drive signals Ct01 or Ct02 that functionally correspond to the control signals Ct2 of the second switching transistor T2 in the exemplary embodiment of FIG. 1. The output side of the optocoupler OC1 is arranged in the drive network of the transistor switch element T1 between the capacitor C3 and the resistor R3 via which—as in the exemplary embodiment of FIG. 3—the auxiliary voltage required for the saturation mode is again supplied to the transistor switch element T1.

As in the first exemplary embodiment according to FIG. 1, the voltage at the control input of the transistor switch element T1 remains below the threshold voltage and this is inhibited as long as the output transistor of the optocoupler OC1 is conductive. When, by contrast, the optocoupler OC1 is inhibited, the capacitor C3 lying between emitter and control input of the transistor switch element T1 is charged via the drop resistor R1, and thus the turn-on function of the transistor switch element T1 is initiated, this having already been described in detail with reference to the exemplary embodiment of FIG. 1 and therefore not having to be explained again.

The described exemplary embodiments show that the electronic switchmode power supply of the invention can also be advantageously employed in combination with a plurality of output stages respectively adapted to a specific application and, in particular, when the device supplied therewith requires a smoothed dc voltage that is relatively high for direct current supplies.

Although various minor changes and modifications might be proposed by those skilled in the art, it will be understood that my wish is to include within the claims of the patent warranted hereon all such changes and modifications as reasonably come within my contribution to the art.

I claim as my invention:

1. An electronic switch-mode power supply, comprising:
   a rectifier circuit connected to a line ac voltage and which has a pair of outputs respectively at a high level and at ground reference potential;
   an output stage for supplying a smooth dc voltage and being connected to the rectifier circuit via an electronic switch;

the electronic switch optionally coupling the high level output of the rectifier circuit to the output stage based on triggering by a switch control signal supplied to the electronic switch;

the electronic switch comprising a transistor switch element and a control transistor; and the transistor switch element comprising a switching path arranged between the high level output of the rectifier circuit and a corresponding input terminal of the output stage, and a control input of said transistor switch element being held to blocking potential via a conductively maintained switching path of said control transistor when it is driven by said switch control signal, or is held to make potential given an inhibited control transistor.

2. The electronic switch-mode power supply of claim 1 wherein the transistor switch element comprises an N-channel semiconductor element.

3. The electronic switch-mode power supply according to claim 2 wherein said control transistor is driven by a binary switch control signal, and wherein a drive network is provided for said transistor switch element comprising a delay circuit coupled to a switching path of said control transistor and which provides a controlled delayed activation of said transistor switch element with a predetermined current limitation.

4. The electronic switch-mode power supply according to claim 3 wherein said switching path of said control transistor at a side connected to said high level output of said rectifier is connected through a drop resistor to said control transistor, and a junction between the drop resistor and the control transistor is coupled to said control input of said transistor switch element.

5. The electronic switch-mode power supply according to claim 3 wherein said delay element comprises a drop resistor lying in series with a switching path of said control transistor at one end and at the other end being connected to said high level output of said rectifier circuit, a further resistor and a further capacitor connected in series, one end of said further resistor being connected to a junction between said drop resistor and said control transistor and said capacitor being connected at an output of said transistor switch element, and wherein a junction between said further resistor and further capacitor is connected to said control input of said transistor switch element.

6. The electronic switch-mode power supply according to claim 3 wherein said control transistor comprises an optocoupler having an output side switching path connected parallel to a capacitor of said delay element, and said control input of said transistor switch element being connected via a drop resistor to said high level output of said rectifier circuit.

7. The electronic switch-mode power supply according to claim 3 wherein a feedback network is arranged between said control input of said transistor switch element and said output stage, said feedback network supplying an auxiliary voltage with which said transistor switch element can be driven into saturation in a steady state of said output stage.

8. The electronic switch-mode power supply according to claim 3 wherein said output stage comprises a step-up regulator of an electronic ballast for the operation of fluorescent lamps, and has an inductor connected to an output of said transistor switch element, and wherein said inductor is coupled via a coupling diode to a storage capacitor comprising an electrolytic capacitor connected to reference potential, and said diode supplying a smooth dc voltage for a power supply of said electronic ballast.

9. The electronic switch-mode power supply according to claim 8 wherein a feedback network is provided for supplying an auxiliary voltage with which said transistor switch element is driven into saturation, said feedback network comprising a series circuit of a further diode and a further resistor arranged between a plus pole of said storage capacitor and said control input of said transistor switch element.

10. An electronic switch-mode power supply, comprising:
a line ac voltage connected at an input of a rectifier circuit;
an output of the rectifier circuit connecting to an input of an electronic switch;
an output of the electronic switch connecting to an input of an output stage having an output for supplying a smooth dc voltage;
said electronic switch having a control transistor connected to a switch control signal and a transistor switch element, said transistor switch element being connected to said output of said rectifier circuit and also to a switching path of said control transistor; and
said transistor switch element having a control input connected to a switching path of said control transistor and to a circuit having a feedback input from said output stage for holding said control input of said transistor switch element to blocking potential when said control transistor is driven by said switch control signal, or is held to make potential given an inhibited control transistor.

* * * * *